United States Patent [19]

Adams et al.

[11] 4,134,125

[45] Jan. 9, 1979

[54] PASSIVATION OF METALLIZED SEMICONDUCTOR SUBSTRATES

[75] Inventors: Arthur C. Adams, Berkeley Heights; Cesar D. Capio, Fords; Hyman J. Levinstein, Berkeley Heights; Shyam P. Murarka, Murray Hill, all of N.J.

[73] Assignee: Bell Telephone Laboratories, Incorporated, Murray Hill, N.J.

[21] Appl. No.: 817,175

[22] Filed: Jul. 20, 1977

[51] Int. Cl.$^2$ ............................................. H01L 29/04
[52] U.S. Cl. ....................................... 357/54; 357/52; 357/55; 357/59
[58] Field of Search ......................... 357/52, 54, 55, 59

[56] References Cited

U.S. PATENT DOCUMENTS

| | | | |
|---|---|---|---|
| 3,189,973 | 6/1965 | Edwards et al. | 357/59 |
| 3,271,632 | 9/1966 | Hartmann | 357/59 |
| 3,465,209 | 9/1969 | Denning et al. | 357/54 |
| 3,597,667 | 8/1971 | Horn | 357/54 |
| 3,971,061 | 7/1976 | Matsushita et al. | 357/52 |
| 4,062,707 | 12/1977 | Mochizuki et al. | 357/54 |

*Primary Examiner*—Edward J. Wojciechowicz
*Attorney, Agent, or Firm*—Lester H. Birnbaum

[57] ABSTRACT

Disclosed is a method and structure for protecting circuit components from the ambient and in particular for protecting the contact metal from the adverse effects of moisture. A first layer of amorphous silicon is deposited over the circuit including the metal contacts. A second layer which may be silicon nitride or silicon dioxide is then deposited over the amorphous silicon. The amorphous silicon layer reduces cracking in the second layer and prevents cracks in the second layer from propagating to the circuit components.

2 Claims, 4 Drawing Figures

PASSIVATION OF METALLIZED SEMICONDUCTOR SUBSTRATES

BACKGROUND OF THE INVENTION

This invention relates to passivation of circuit components, and in particular to passivation of metal contacts formed as a part of said circuits.

The need for passivation of circuits, and in particular silicon integrated circuits and devices, has long been recognized. The usual approach is to house the circuit or device in an hermetic package. While effective in protecting the components from moisture and contaminants in the air, this method is expensive. An alternative approach is to cover the components with a layer of silicon nitride or a dual layer of silicon nitride and silicon dioxide. The purpose of such layer or layers is to provide the necessary protection from the ambient without the need for hermetic packaging. The silicon nitride layer can be deposited so that it is essentially crack-free. However, during subsequent processing such as window opening, bonding and wafer separation, cracks develop in the layer which propagate to the metal contacts on the surface of the semiconductor. Since the metal, which is typically aluminum, is susceptible to moisture in the air, such cracking results in poor circuit reliability and low yields. If a layer of $SiO_2$ is interposed between the metal and silicon nitride, the cracks will propagate through both layers and the same adverse effects are observed.

It is therefore a primary object of the invention to provide for passivation of circuits so that cracking of the passivation layer is minimized, and any cracking which does occur will not have a significant effect on the circuit components.

SUMMARY OF THE INVENTION

This and other objects are achieved in accordance with the invention which involves depositing a layer of amorphous silicon over the circuit or device followed by deposition of a passivating layer such as silicon nitride or silicon dioxide. It was discovered that the amorphous silicon layer tends to stabilize the passivation layer so that cracking is reduced, and also remains intact when cracks do develop in the passivation layer so that the cracks do not propagate to the contact metal or semiconductor surface.

BRIEF DESCRIPTION OF THE DRAWING

These and other features of the invention are delineated in detail in the following description. In the drawing.

It will be understood that these figures are not drawn to scale.

DETAILED DESCRIPTION

Figure 1:
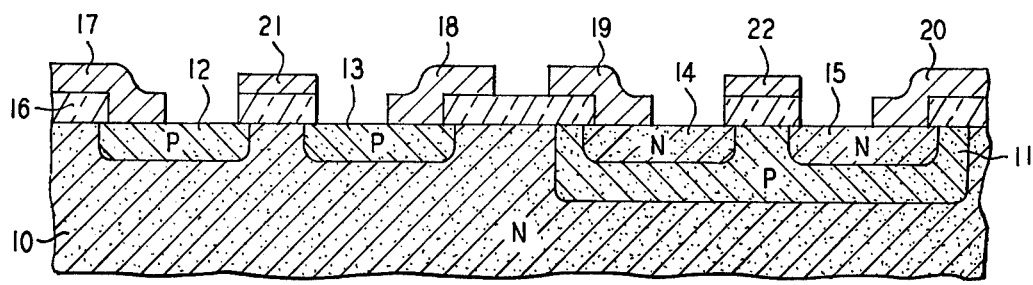
FIGS. 1-3 are cross-sectional views of a portion of an integrated circuit during various stages of fabrication in accordance with one embodiment of the invention.

One embodiment of the invention will be described with reference to the sequence of steps illustrated in FIGS. 1-3. FIG. 1 shows a typical complementary MOS transistor structure fabricated from a semiconductor wafer. It will be understood that this figure illustrates only a portion of the complete wafer which would include many other devices. Thus, the device of FIG. 1 can be cut from the wafer to form a discrete device or can be part of an integrated circuit. It will also be realized that the structure of FIG. 1 is only illustrative and the invention can be practiced with any semiconductor device or integrated circuit which requires passivation.

The starting material in this example is an n-type semiconductor substrate 10. In the context of this application, it will be understood that "semiconductor substrate" is intended to include any epitaxial layer which may be included as part of a device structure. Formed in said substrate is a p-type region 11, and diffused therein are n-type regions 14 and 15 which constitute the source and drain regions of one transistor. P-type regions 12 and 13 constitute the source and drain regions for the other transistor. Disposed on the surface of the substrate, except where contact to the source and drain regions is required, is a layer of phosphorous doped silicon dioxide, 16, which provides passivation of the p-n junctions at the surface. Polysilicon gate electrodes 21 and 22 are disposed on the oxide in the area between source and drain regions. Also included are metallizations 17, 18, 19 and 20 which provide ohmic contact to the source and drain regions. The contacts in this example were aluminum, but other known contact metals may be employed.

Figure 2:
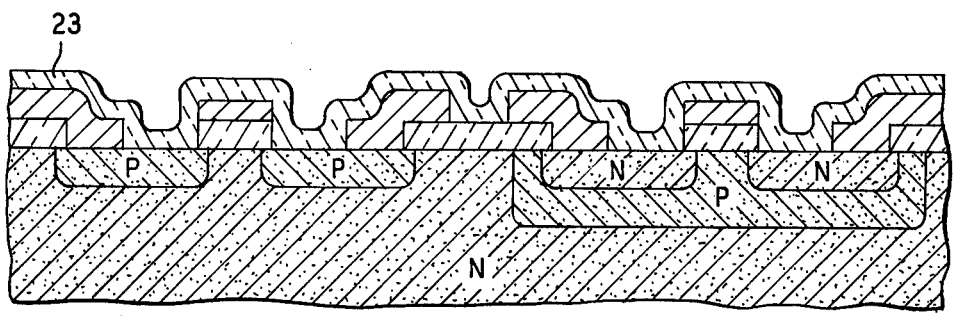

In accordance with a key feature of the invention, a thin layer of amorphous silicon, 23, was deposited over the metallized substrate as shown in FIG. 2. The thickness of the layer was approximately 1000 angstroms although a range of 500-1500 angstroms is normally preferred. Thicknesses outside this range might be employed. However, too thick a layer may result in saturation of the contacts by the silicon in subsequent annealing, while too thin a layer may not afford adequate protection.

Figure 4:
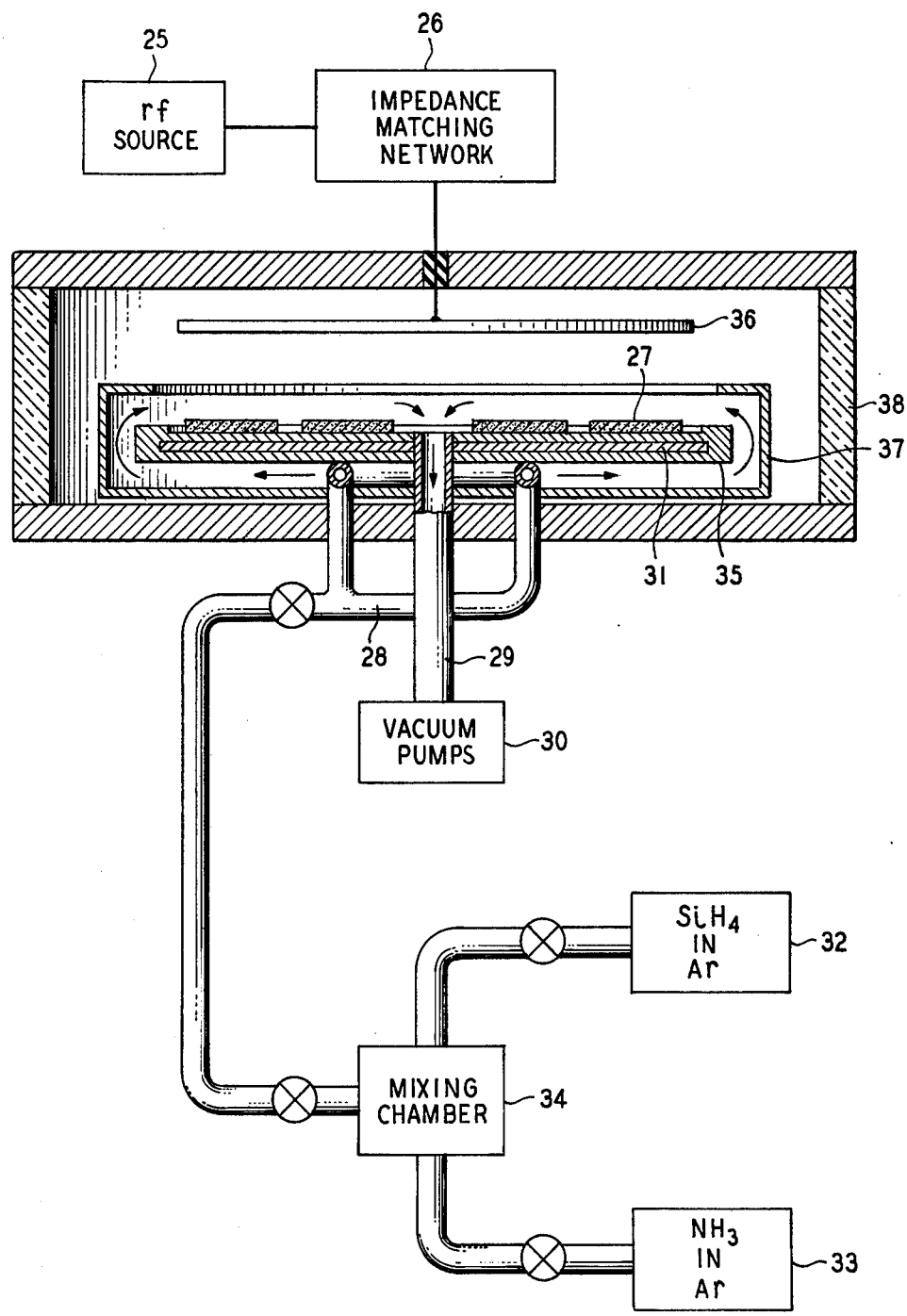
FIG. 4 is a cross-sectional, partly schematic, view of an apparatus which may be employed with the method in accordance with one embodiment of the invention.

A particularly effective means of depositing the amorphous silicon layer is by plasma deposition. The particular plasma deposition apparatus employed is illustrated in the cross-sectional, partly schematic, view of FIG. 4. The apparatus includes a chamber 38 which is evacuated, a first electrode 36 coupled to an rf source 25 through impedance matching network 26, a second electrode 35 which supports the semiconductor wafers 27, and a gas flow shield 37 which surrounds electrode 35 except for the portion on which the wafers are placed. The apparatus further includes pipe 28 for introducing gas into the chamber and pipe 29 and vacuum pump 30 for gas exhaust. Electrode 35 includes a heater element 31 embedded therein for heating the wafers at a preselected temperature. Sources of silane ($SiH_4$) in a cariier gas of argon, 32, and ammonia ($NH_3$) in a carrier gas of argon, 33, are coupled to a mixing chamber 34 and then to input pipe 28 of the chamber. The proportion of silane was approximately 3% and that of ammonia approximately 5%.

In operation, the metallized semiconductor substrates 27 were placed on electrode 35 as indicated and the chamber was evacuated to a pressure of approximately 0.8 Torr. The heaters 31 kept the substrates at a temperature of approximately 250 degrees C. For the deposition of amorphous silicon, only the silane in argon from source 32 was admitted into the chamber, following the direction of the arrows. The rf power source was actuated to the desired power level, in this case approximately 150 watts, in order to create the rf glow discharge reaction between electrodes 35 and 36. The shield, 37, essentially confines the discharge reaction to the area above the top surface of electrode 35 and thereby intensifies the reaction above the semiconductor wafers. The gas flow utilized was approximately 2.1 l/min and the power was on for approximately 2 minutes. The plasma discharge caused the silane to decompose and silicon was therefore deposited on the surface of the wafers. The low temperature at which the reaction takes place results in the layer of silicon being amorphous. A temperature of less than 500 degrees C is needed to avoid melting of aluminum. Thus, the temperature should lie within the range 30–500 degrees C. Of course, it will be realized that other parameters of the method of deposition can be varied as indicated by the preferred ranges below:

Pressure: 0.3–2.0 Torr
Power: 25–300 watts
Time of reaction: 0.5–5 min.
Flow rate: 0.5–2.5 l/min
Proportion of silane: 0.5–10 volume percent It was discovered that a metallurgical bond was formed between the aluminum contacts and amorphous silicon layer during the subsequent standard annealing at 450 degrees for ½ hour to improve gate characteristics. Advantageously, only a small amount of silicon reacted with the metal so that saturation did not occur. This resulted in hardening of the metal without the adverse effect of silicon precipitation. An effective anneal would be 400–500 degrees C. for 0.25–1 hours. Although desirable, such an annealing is not essential for the effectiveness of the present invention.

Figure 3:
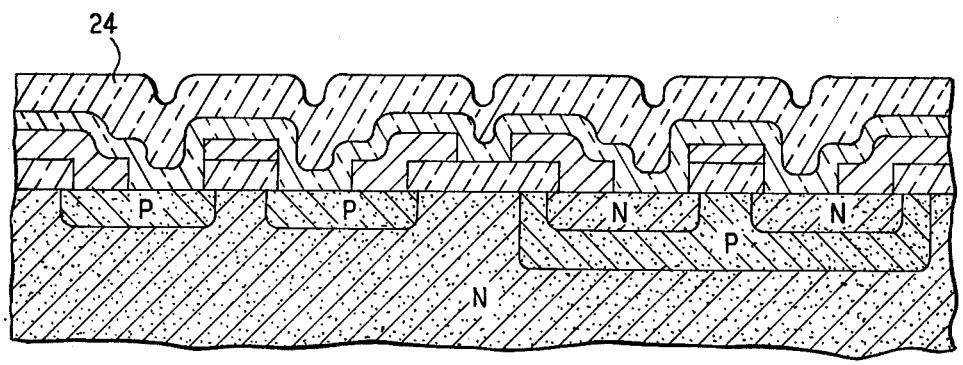

In accordance with the next step, as illustrated in FIG. 3, a passivation layer of silicon nitride, 24, was deposited over the amorphous silicon layer. The thickness of the layer was approximately 1.1μm, although a range of approximately 0.5–1.5μm would be useful. The method employed was essentially the same plasma deposition process used for the amorphous silicon. Here, however, the ammonia in argon from source 33 of FIG. 4 was mixed with the silane in argon from source 32 in the mixing chamber 34 prior to admission of the reaction gases in the chamber. The gases were mixed so as to give approximately 0.6% of silane and 1.0% of ammonia in argon. The chamber was evacuated to approximately 1.0 Torr and the substrates heated to 330 degrees C. The power level was 40 watts and the gas flow was 3 l/min. These parameters may be varied as indicated by the preferred ranges below:

Pressure: 0.3–2.0 Torr
Power: 25–100 watts
Temperature: 250–400 degrees C.
Flow rate: 1.0–4.0 l/min
Proportion of silane: 0.3–1.0 volume percent
Proportion of ammonia: 0.5–1.5 volume percent
Time of reaction: 60–90 minutes The plasma deposition method and apparatus is described in more detail in U.S. Patent application of Hauser and Sinha, Ser. No. 651,556, filed Jan. 22, 1976, which is incorporated by reference herein.

The silicon nitride layer performs the passivation function as is known in the art. However, it was discovered that the presence of the amorphous silicon layer tends to inhibit cracking in the silicon nitride layer. More important, when cracks do develop in the silicon nitride layer, they do not propagate through the amorphous silicon layer. The contacts and the remaining portions of the circuit therefore remain protected from moisture and contaminants in the air such as sodium. The amorphous silicon also has a high electrical resistance (greater than $10^5$ $\Omega$-cm) so that there is no conduction between the aluminum contacts.

Although the embodiment described utilizes silicon nitride as the passivation layer, other materials such as silicon dioxide, which are capable of protecting the circuit from the atmosphere, may be used in combination with the amorphous silicon layer. Also, although plasma deposition is preferred, other means of depositing the double layer such as sputtering may be employed. In addition, when other metals such as tungsten silicide are employed for the contacts, higher temperature deposition methods such as chemical vapor deposition may be used.

Various additional modifications will become apparent to those skilled in the art. All such variations which basically rely on the teachings through which the invention has advanced the art are properly considered within the spirit and scope of the invention.

What is claimed is:

1. A semiconductor device comprising a silicon semiconductor substrate with a major surface, metal contacts comprising aluminum formed on said substrate, a first layer comprising amorphous silicon with a resistance of at least $10^5$ $\Omega$-cm formed over essentially the entire surface of said metal and substrate to a thickness in the range 500–1500 angstroms and metallurgically bonded to said metal contacts, and a second layer comprising silicon nitride formed on essentially the entire surface of said first layer to a thickness in the range 0.5–1.5 μm whereby said amorphous silicon layer inhibits cracking in said silicon nitride layer and cracks which develop in said silicon nitride layer do not propagate through said amorphous silicon layer so that the combination of said layers protects the device including the metal contacts from contaminants and moisture in the air.

2. The device according to claim 1 further comprising a layer of silicon dioxide formed on the surface of said substrate with said first and second layers formed thereover.

* * * * *